United States Patent
Li et al.

(10) Patent No.: US 6,964,580 B1
(45) Date of Patent: Nov. 15, 2005

(54) CABLE STRAIN-RELIEF MEMBER FOR A PC FAN

(75) Inventors: Nien-Lun Li, Hsin-Chuang (TW);
Chih-Kuan Liu, Hsin-Chuang (TW);
Hsu-Jung Lin, Hsin-Chuang (TW);
Ping-Tsang Ho, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/890,139

(22) Filed: Jul. 14, 2004

(51) Int. Cl.[7] .............................................. H01R 13/58
(52) U.S. Cl. ..................................................... 439/449
(58) Field of Search .......................... 439/449; 24/458; 174/135, 138; 248/73, 214, 74.1

(56) References Cited

U.S. PATENT DOCUMENTS

| | | | | |
|---|---|---|---|---|
| 4,356,987 A | * | 11/1982 | Schmid ........................ 248/73 |
| 4,636,024 A | * | 1/1987 | Yahata ........................ 439/449 |
| 5,728,976 A | * | 3/1998 | Santucci et al. ............. 174/135 |
| 6,124,552 A | * | 9/2000 | Boe ............................ 174/135 |
| 6,216,320 B1 | * | 4/2001 | Schauermann ............... 24/458 |

* cited by examiner

*Primary Examiner*—J. F. Duverne
(74) *Attorney, Agent, or Firm*—Troxell Law Office, PLLC

(57) ABSTRACT

The present invention is to provide a cable strain-relief member for a PC fan, comprising a pressing part, two locking parts at both ends of the pressing part, and two releasing parts at the two joint portions between the pressing part and the locking parts. Accordingly, the strain-relief member can be set at a rib of the fan frame to firmly bind lead wires on the rib of the fan frame to prevent from being swung left and right, or being shaken up and down, to be loosened by an external force. Besides, the strain-relief member can be released for easy maintenance and packing of the fan according to the actual need.

6 Claims, 9 Drawing Sheets

CABLE STRAIN-RELIEF MEMBER FOR A PC FAN

FIELD OF THE INVENTION

The present invention relates to a strain-relief member. More particularly, the present invention relates to a strain-relief member which firmly binds lead wires of a circuit board at a rib of a fan frame to prevent from being swung left and right, or being shaken up and down, to be loosened by an external force. Besides, the strain-relief member can be released according to the actual need for easy maintenance and packing of the fan.

DESCRIPTION OF THE RELATED ARTS

As is known, the binding method for lead wires of a circuit board of a fan according to the prior art, as shown in FIG. 5, is done by guiding the lead wires 32 to a rib 31 of the fan frame 3 and putting it in a fillister 34 of the rib 31. Then, the lead wires 32 and the rib 31 are bound by a constriction bond 33 to establish the lead wires 32 at the rib 31.

The above method according to the prior art can establish the lead wires 32 at the rib 31. But, because the constriction bond 33 is bound around the outside of the rib 31 and the lead wires 22 is put in the fillister 34 of the rib 31, the constriction bond 33 can only put a pressure directly on the outside of the rib 31 but not on the lead wires 22. So, no matter how tight the lead wires 22 are pulled, the lead wires 32 may be easily swung left and right, or be shaken up and down, to be loosened. And, because the constriction bond 33 can not be easily released after being tightened, a user is not able to release the constriction bond 33 on maintenance or packing, which causes trouble on usage.

To overcome the above disadvantage, another prior art introduces a fixture structure for binding the lead wires of the circuit board of the fan, as shown in FIG. 6, which comprised a fixture part 42 at a proper position on the rib 41 of the fan frame 4. The fixture part 42 is shaped somewhat like 'Γ', which guides the lead wires 43 of the circuit board along the rib 41 of the fan frame 4 and contains the lead wires 43 within.

The above fixture part 42 can fix the lead wires 43 of the circuit board. Because the space between the fixture part 42 and the surface of the rib 41 needs to be larger than the outer diameter of the lead wire 43, the lead wires 43 can be easily put between the fixture part 42 and the surface of the rib 41. And, although the space between the fixture part 42 and the surface of the rib 41 is larger than the outer diameter of the lead wire 43 to overcome the disadvantage of inability to release the constriction bond 33, the lead wires 43 may be swung left and right, or be shaken up and down, to be loosened. So, the binding method and the fixture structure according to the prior arts can not fulfill the requirements from the user on actual usage.

SUMMARY OF THE INVENTION

Therefore, the main purpose of the present invention is that, by setting a strain-relief member at a rib of a fan frame, lead wires can be firmly bound at the rib of the fan frame so that the lead wires will not be swung left and right, or be shaken up and down, to be loosened by an external force.

Another purpose of the present invention is that the strain-relief member can be released according to the actual need for easy maintenance and packing of the fan.

To achieve the above purposes, the present invention is a cable strain-relief member for a PC fan, comprising a pressing part, two locking parts at both ends of the pressing part and two releasing parts at the two joint portions between the pressing part and the locking parts. So, the present invention can be set at a rib of a fan frame to bind lead wires at the rib of the fan frame to prevent from being swung left and right, or being shaken up and down, to be loosened by an external force. Besides, the strain-relief member can be released according to the actual need for easy maintenance and packing of the fan.

BRIEF DESCRIPTIONS OF THE DRAWINGS

The present invention will be better understood from the following detailed description of preferred embodiments of the invention, taken in conjunction with the accompanying drawings, in which FIG. 1 is a perspective view according to the present invention;

FIG. 2A is a view showing an enlargement of area 20 of FIG. 2 according to the present invention.

FIG. 5A is a view showing an enlargement of area 331 of FIG. 5 according to a prior art.

FIG. 6A is a view showing an enlargement of area 421 of FIG. 6 according to a prior art; and

DESCRIPTION OF THE PREFERRED EMBODIMENTS

The following descriptions of the preferred embodiments are provided to understand the features and the structures of the present invention.

Figure 1:
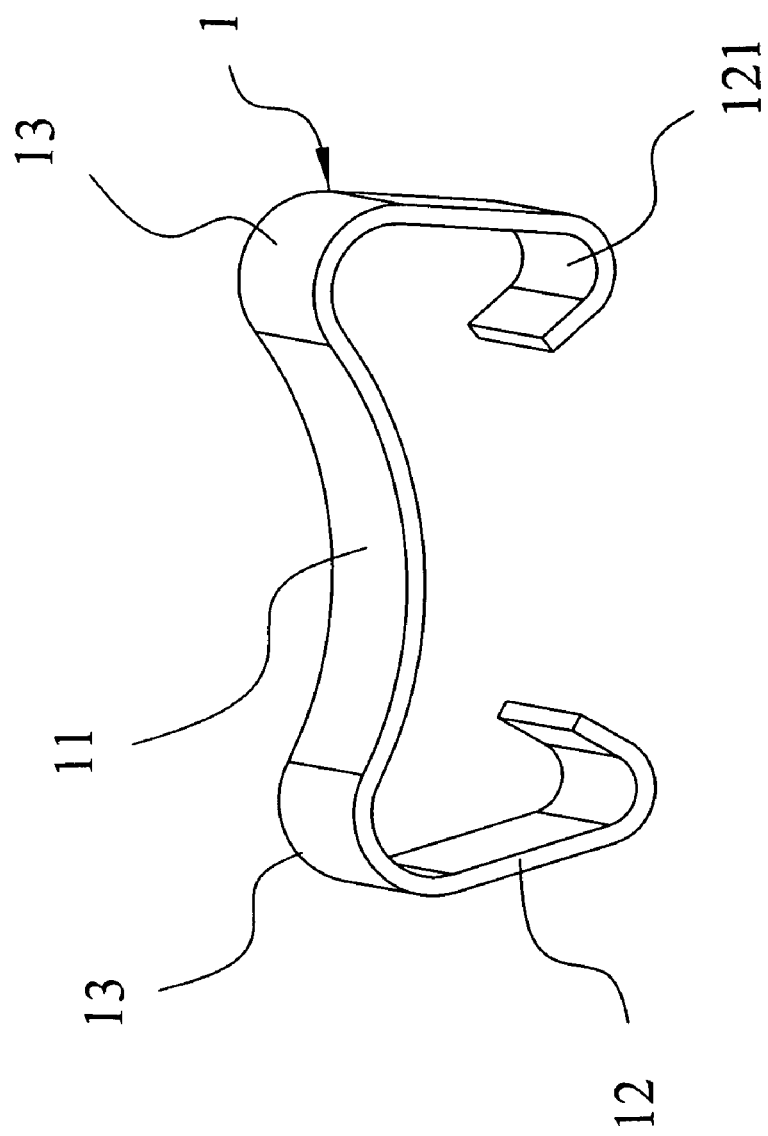

Please refer to FIG. 1, which is a perspective view according to the present invention. As shown in the figure, the present invention is a cable strain-relief member for a PC fan, comprising a pressing part 11, two locking parts 12 and two releasing parts 13, formed as an integral whole. The present invention can be set at a rib of a fan frame to firmly bind lead wires of the circuit board of the fan so that the lead wires of the circuit board can be limited at the rib of the fan frame to prevent from being swung left and right, or being shaken up and down, to be loosened by an external force. Besides, the strain-relief member 1 can be released for easy maintenance and packing of the fan according to the actual need.

The pressing part 11 mentioned above comprises a cambered surface.

The two locking parts 12 are at both ends of the pressing part 11, extending correspondingly in a little tilted way toward the same direction (downwardly from the pressing part 11); and a hook 121 is at the end of each locking part 12.

The two releasing parts 13 are at the two joint portions between the pressing part 11 and the locking parts 12, each comprising a cambered surface. By the above structure improvement, a novel strain-relief member is obtained.

Figure 2:
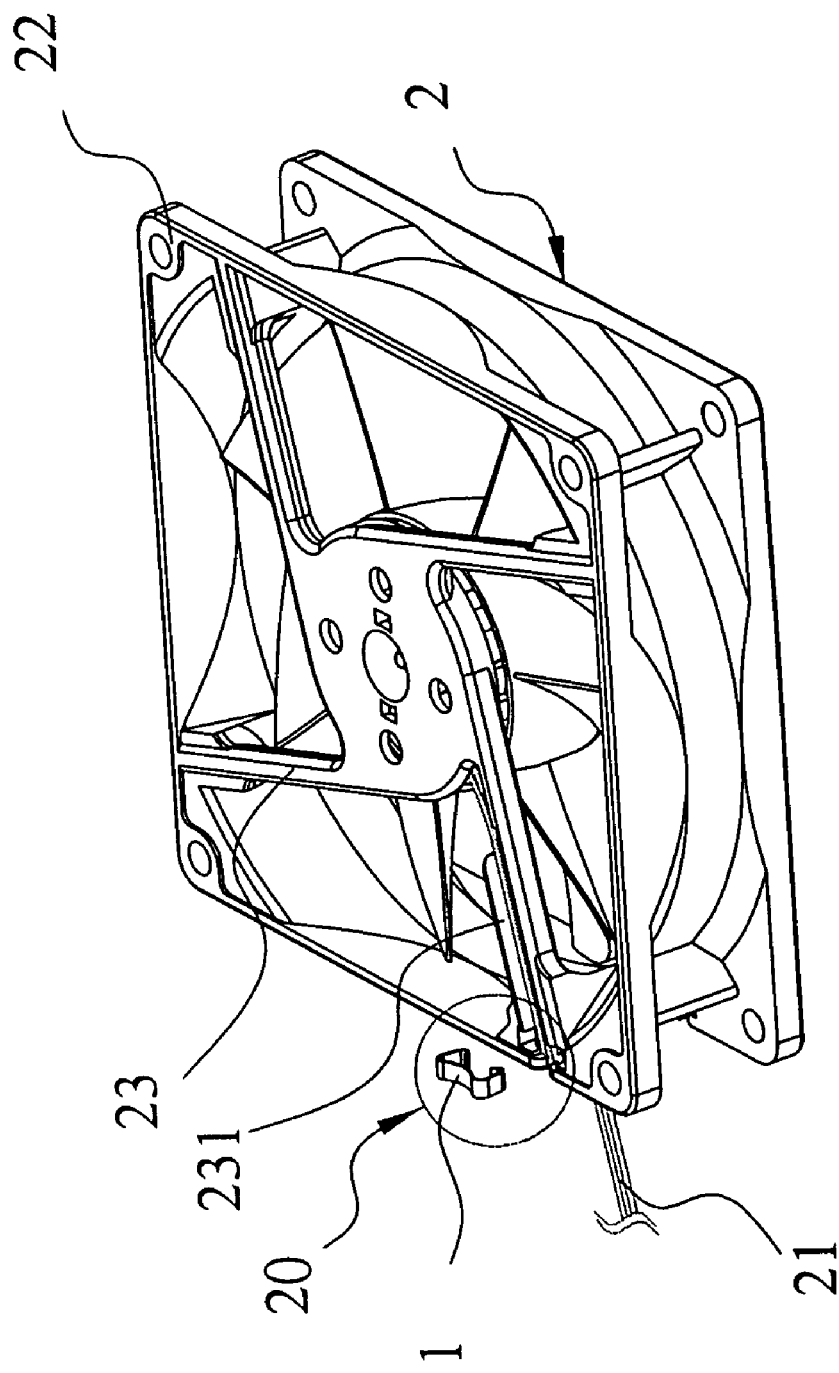
FIG. 2 is a view showing a status of use on assembling according to the present invention.
Figure 2:
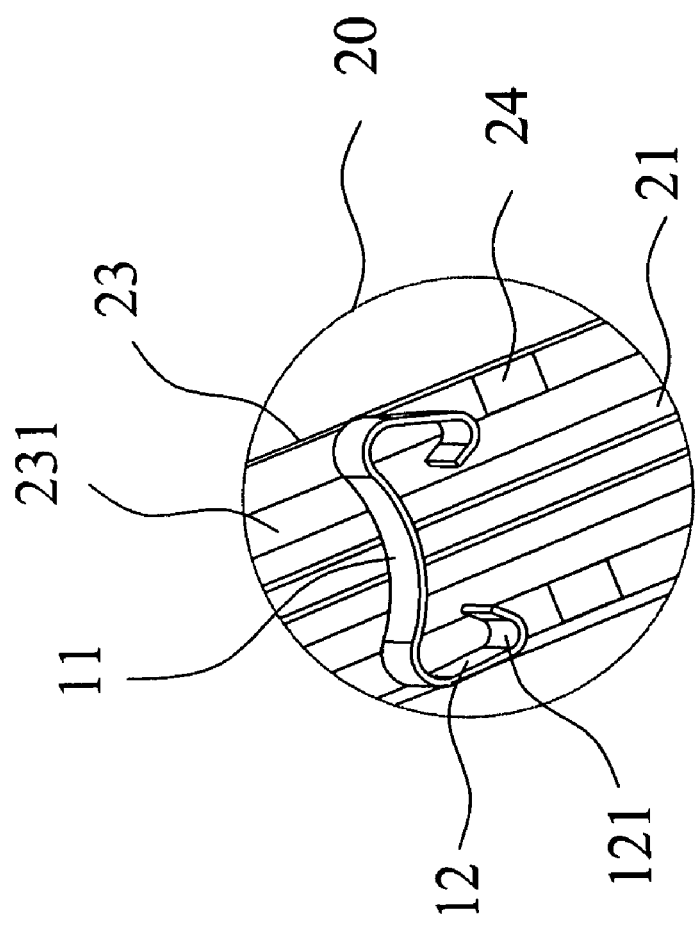
Figure 3:
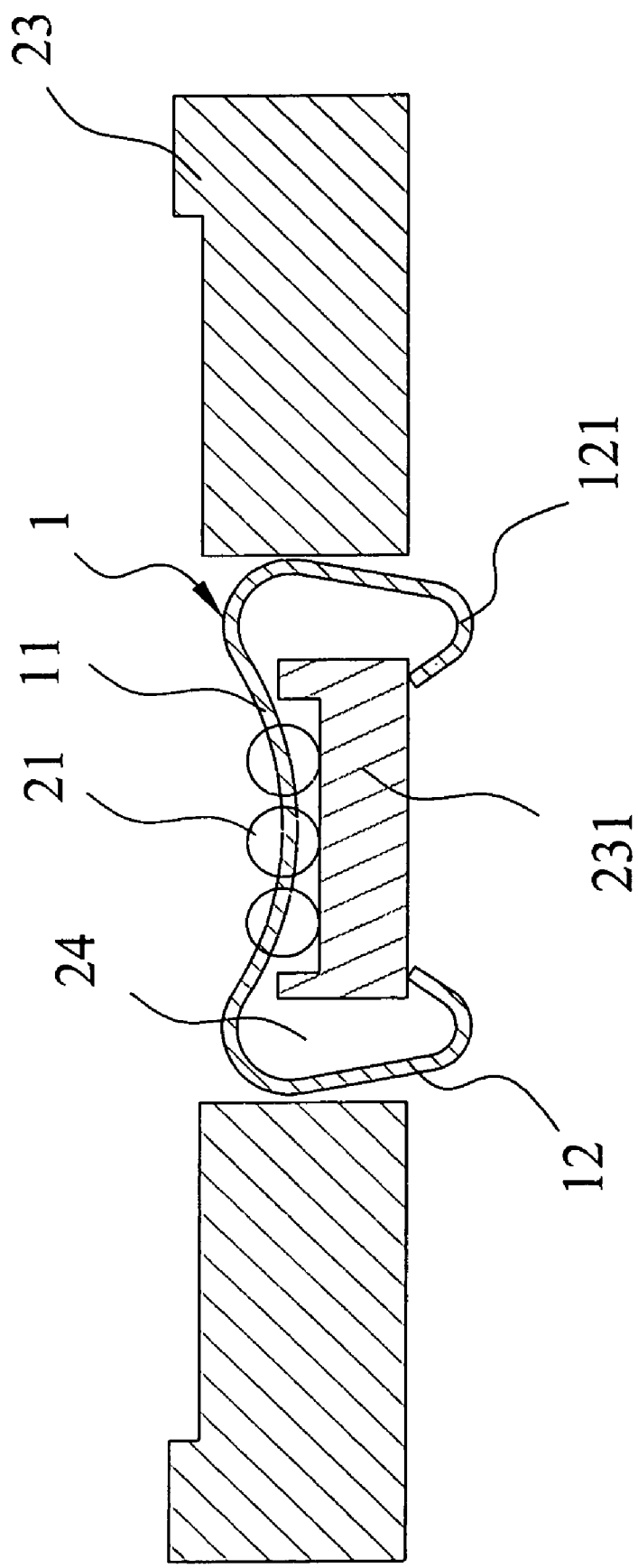
FIG. 3 is a sectional view after the assembling according to the present invention.

Please refer to FIG. 2, FIG. 2A and FIG. 3, which are a view showing a status of use on assembling, a view showing an enlargement of area 20 of FIG. 2, and a sectional view after the assembling, according to the present invention. As shown in the figures, when using the present invention, the lead wires 21 of the circuit board of the fan 2 is pulled and directed to a rib 23 of the fan frame 22. The rib 23 comprises a fillister 231 for containing the lead wires 21 of the circuit board. Then the strain-relief member 1 is set at an end of the rib 23 where the locking parts 23 of the strain-relief member 1 is corresponding to two put-through holes 24 (while the lead wires 21 on the rib 23 is between the two put-through holes 24.) The two locking parts 12 are put into the put-through holes 24 by an external force so that the two locking parts 12 is firmly locked at the bottom of the rib 23 by the tilted locking parts 12 and the hooks 121 at the end. So, the strain-relief member 1 is pressing the lead wires 21 by its cambered pressing part 11 so that the lead wires 21 are limited in the fillister 231 of the rib 23 to prevent from being swung left and right, or being shaken up and down, to be loosened by an external force.

Figure 4:
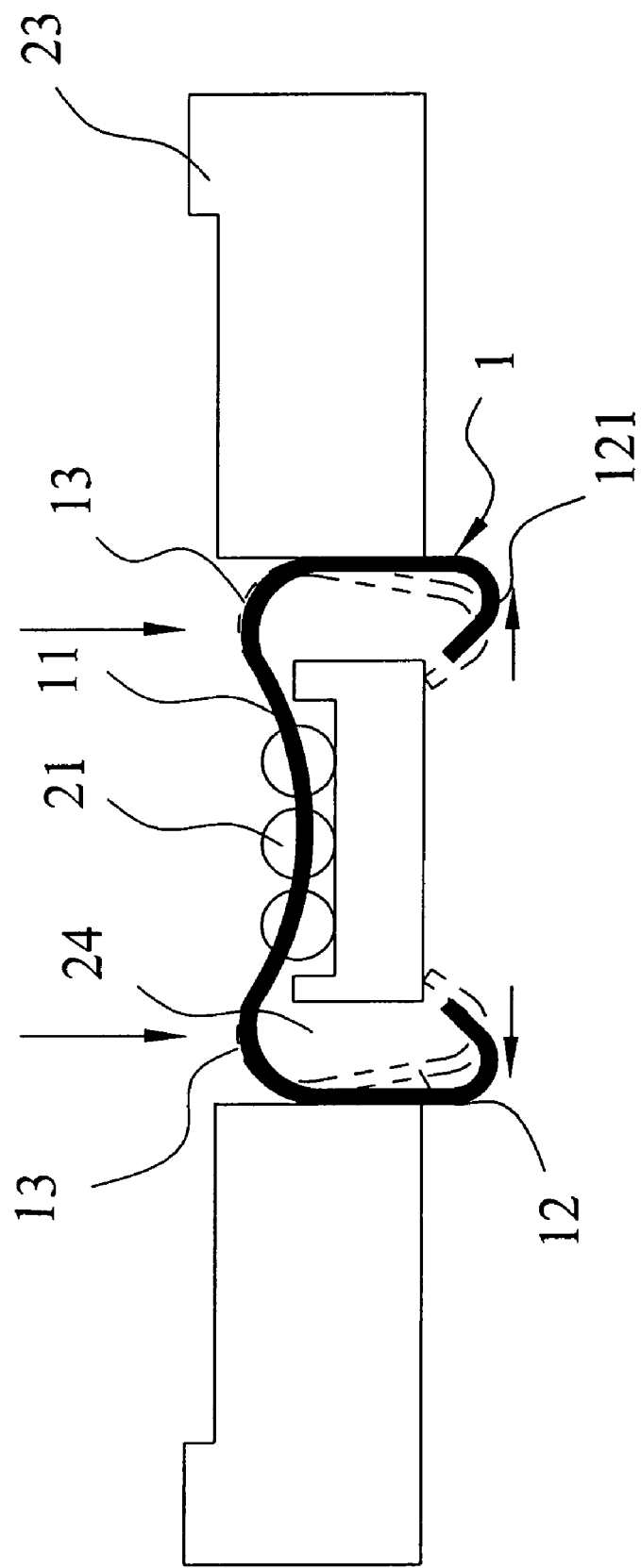
FIG. 4 is a view showing a status of releasing according to the present invention.
Figure 5:
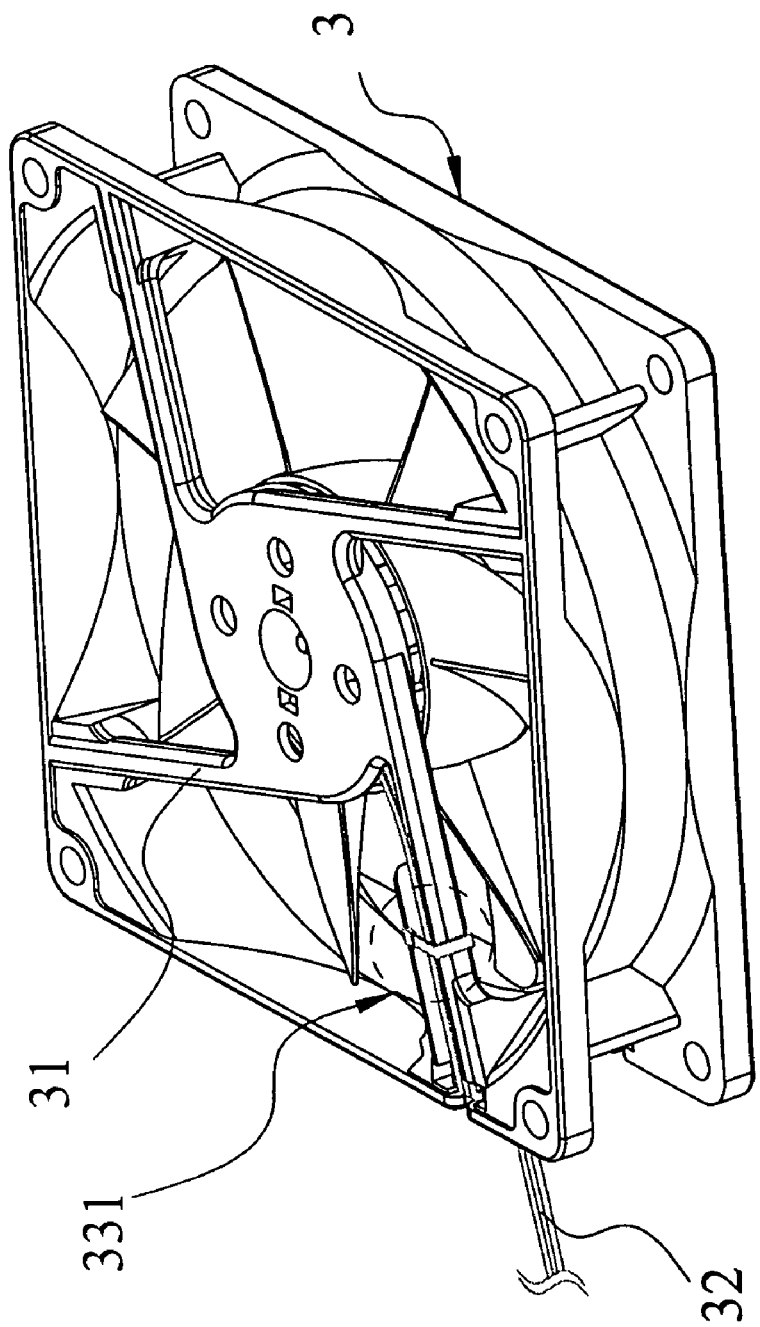
FIG. 5 is a view showing a status of use according to a prior art.
Figure 5:
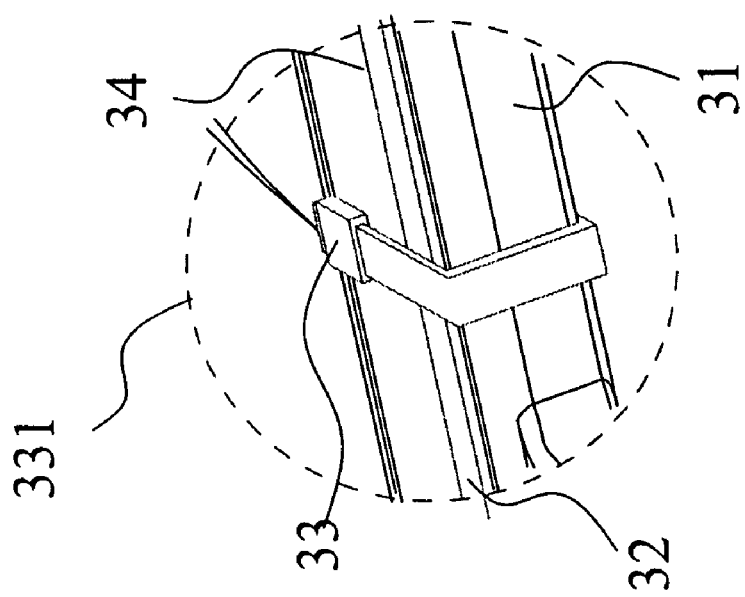
Figure 6:
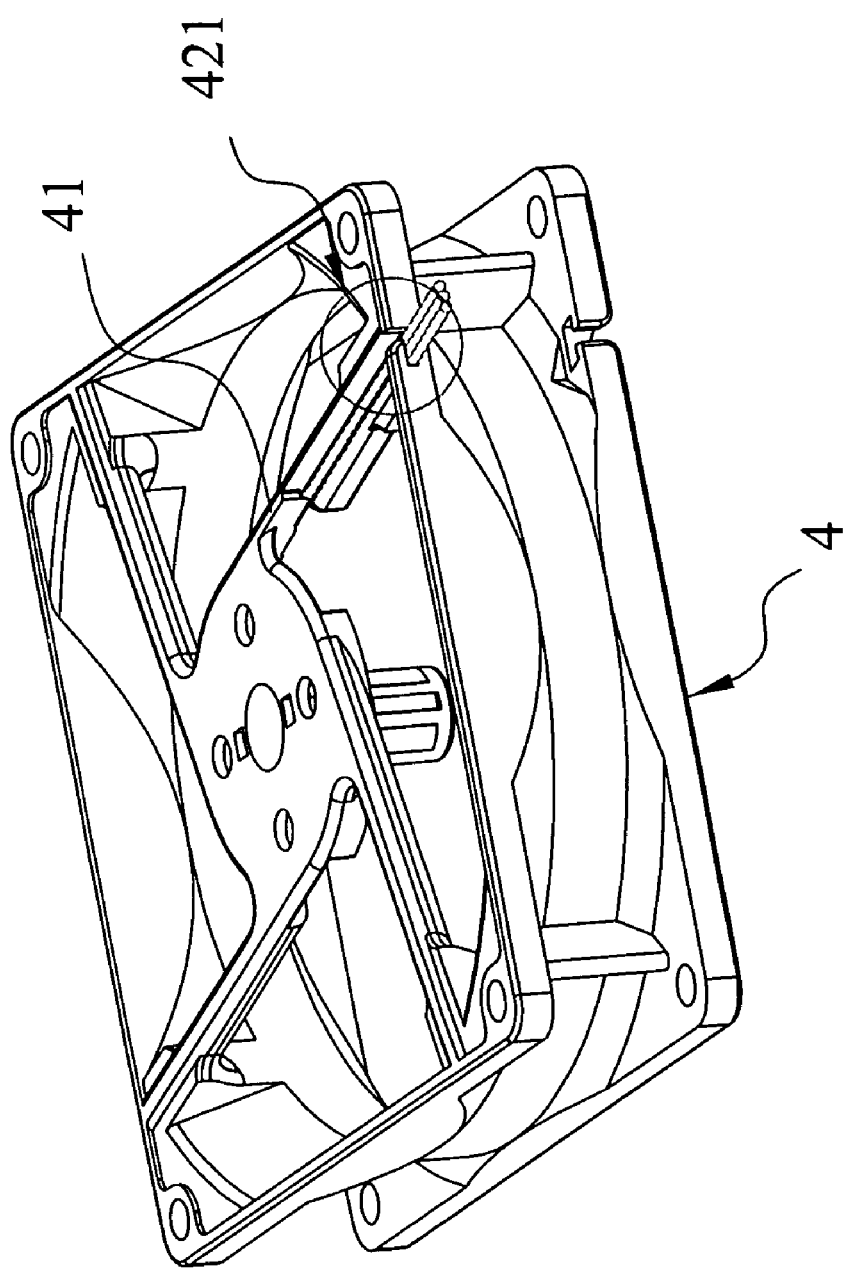
FIG. 6 is a view showing a status of use according to another prior art.
Figure 6:
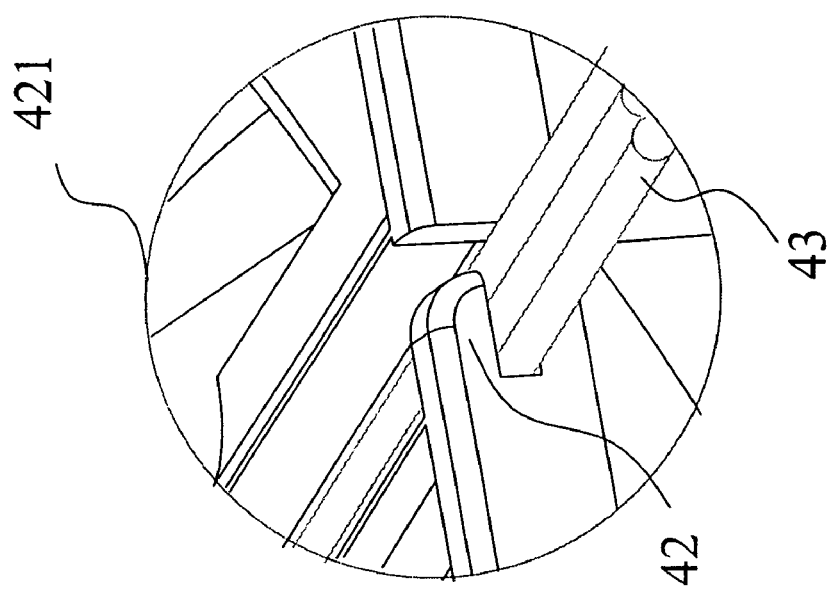

Please refer to FIG. 4, which is a view showing a status of releasing according to the present invention. As shown in the figure, when the user is doing the maintenance and the packing according to the actual need and is releasing the strain-relief member 1 according to the present invention, an external force is added downwardly on the releasing parts 13 at the two ends of the pressing part 11 to make the two tilted locking parts 12 become straightly vertical to the pressing part 11 by an outward force produced so that the hooks 121 at the ends of the two locking parts 12 are released from the bottom of the rib 23 and the locking parts 12 can be pulled out from the two put-through holes 24. By doing so, the strain-relief member 1 can be released.

To sum up, the present invention can effectively overcome the disadvantages of the prior arts so that the lead wires 21 of the circuit board can be firmly bound on the rib 23 of the fan frame 22 to prevent from being swung left and right, or being shaken up and down, to be loosened by an external force; and, by the design of the releasing parts 13, the strain-relief member 1 can be released for easy maintenance and packing of the fan 2 according to the actual need.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A cable strain-relief member for fixing lead wires of a fan circuit board to a rib of a fan frame of a PC fan, the cable strain-relief member comprising:
    a) a pressing part;
    b) two locking parts, one of the two locking parts is located on each of two opposing sides of the pressing part; and
    c) two releasing parts, one of the two releasing parts is located at a joint portion between each of the two locking parts and each of the two opposing sides of the pressing part, each of the two locking parts extending downwardly from the two releasing parts,
    wherein each of the two locking parts having a hook curving inwardly toward a bottom of the pressing part.

2. The cable strain-relief member according to claim 1, wherein the pressing part has a curved shape curving toward each hook at a center thereof.

3. The cable strain-relief member according to claim 1, wherein the pressing part is cambered.

4. The cable strain-relief member according to claim 1, wherein the two locking parts tilt inwardly along a length thereof moving away from the releasing parts toward each hook.

5. The cable strain-relief member according to claim 1, wherein each of the two releasing parts are cambered.

6. The cable strain-relief member according to claim 1, wherein the pressing part, the two locking parts, and the two releasing parts are integrally formed.

* * * * *